(12) United States Patent
Wang

(10) Patent No.: US 12,364,086 B2
(45) Date of Patent: Jul. 15, 2025

(54) MICRO LED DISPLAY PANEL AND TRANSFER PRINTING METHOD OF MICRO LED

(71) Applicant: TCL China Star Optoelectronics Technology Co., LTD., Shenzhen (CN)

(72) Inventor: Zhiwu Wang, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/648,637

(22) PCT Filed: Feb. 28, 2020

(86) PCT No.: PCT/CN2020/077248
§ 371 (c)(1),
(2) Date: Mar. 18, 2020

(87) PCT Pub. No.: WO2021/159564
PCT Pub. Date: Aug. 19, 2021

(65) Prior Publication Data
US 2022/0375988 A1   Nov. 24, 2022

(30) Foreign Application Priority Data

Feb. 10, 2020   (CN) .......................... 202010085024.7

(51) Int. Cl.
*H10H 29/14* (2025.01)
*H10H 20/01* (2025.01)
(Continued)

(52) U.S. Cl.
CPC .......... *H10H 29/142* (2025.01); *H10H 20/01* (2025.01); *H10H 20/8312* (2025.01);
(Continued)

(58) Field of Classification Search
CPC .. H10H 29/142; H10H 20/01; H10H 20/8312; H10H 20/857; H10H 20/032;
(Continued)

(56) References Cited

U.S. PATENT DOCUMENTS

2012/0211754 A1   8/2012   Park
2017/0018691 A1*  1/2017   Lee ...................... H01L 21/6835
(Continued)

FOREIGN PATENT DOCUMENTS

CN    108573992 A    9/2018
CN    108878472 A    11/2018
(Continued)

OTHER PUBLICATIONS

Chinese Office Action in corresponding Chinese Patent Application No. 202010085024.7 dated Jun. 16, 2022, pp. 1-9.
(Continued)

*Primary Examiner* — Su C Kim
(74) *Attorney, Agent, or Firm* — PV IP PC; Wei Te Chung

(57) ABSTRACT

The present application provides a micro light emitting diode (LED) display panel and a transfer printing method of a micro LED. The micro LED display panel includes micro LED strips arranged on a driving substrate. Each micro LED strip includes at least two micro LEDs. The micro LEDs are electrically connected to thin film transistors (TFTs) through bottom electrodes of the driving substrate. By having a light shielding layer on the driving substrate, the present application solves problems like light leakage and color mixing of the display panel.

9 Claims, 9 Drawing Sheets

(51) Int. Cl.
  *H10H 20/831* (2025.01)
  *H10H 20/857* (2025.01)
(52) U.S. Cl.
  CPC ......... *H10H 20/857* (2025.01); *H10H 20/032* (2025.01); *H10H 20/0364* (2025.01)
(58) Field of Classification Search
  CPC ........... H10H 20/0364; H10H 20/0363; H10H 20/855; H10H 20/018; H10H 20/85; H10H 20/036; H01L 25/0753; H01L 25/167; H10D 30/6723
  See application file for complete search history.

(56) References Cited

U.S. PATENT DOCUMENTS

| | | | | |
|---|---|---|---|---|
| 2017/0062515 | A1* | 3/2017 | Kim | H01L 33/58 |
| 2017/0207249 | A1* | 7/2017 | Rhee | H01L 27/1248 |
| 2017/0337870 | A1* | 11/2017 | Lin | H01L 25/0753 |
| 2018/0277725 | A1* | 9/2018 | Xiong | H01L 33/502 |
| 2018/0329212 | A1* | 11/2018 | Aiki | H01L 27/156 |
| 2019/0074324 | A1* | 3/2019 | Kim | H01L 33/505 |
| 2019/0206926 | A1* | 7/2019 | Diana | H01L 33/382 |
| 2019/0348585 | A1 | 11/2019 | Woodgate | |
| 2020/0303585 | A1* | 9/2020 | Lo | H01L 27/15 |
| 2021/0132440 | A1* | 5/2021 | Kim | G02F 1/133614 |

FOREIGN PATENT DOCUMENTS

| | | |
|---|---|---|
| CN | 109119452 A | 1/2019 |
| CN | 110034224 A | 7/2019 |
| CN | 110112141 A | 8/2019 |
| CN | 110391261 A | 10/2019 |
| KR | 20160056390 A | 5/2016 |

OTHER PUBLICATIONS

International Search Report in International application No. PCT/CN2020/077248, mailed on Nov. 2, 2020.
Written Opinion of the International Searching Authority in International application No. PCT/CN2020/077248, mailed on Nov. 2, 2020.

* cited by examiner

MICRO LED DISPLAY PANEL AND TRANSFER PRINTING METHOD OF MICRO LED

CROSS REFERENCE TO RELATED APPLICATIONS

The present application claims the priority of China Patent Application No. 202010085024.7, filed with the National Intellectual Property Administration on Feb. 10, 2020, titled "MICRO LED DISPLAY PANEL AND TRANSFER PRINTING METHOD OF MICRO LED", which is incorporated by reference in the present application in its entirety.

FIELD OF DISCLOSURE

The present application relates to a field of display technology and in particular, to a micro light emitting diode (LED) display panel and a micro LED.

DESCRIPTION OF RELATED ART

Micro light emitting diodes (LEDs) consume only one-tenth the power of liquid crystal displays (LCDs). Micro LEDs are self-luminous like organic light-emitting diode (OLED) displays. They can reduce the distance between pixels from millimeter level to micron level, and the color saturation is close to OLED. A micro LED system can further reduce volume and weight and provides advantages such as low power consumption and fast response. The most important thing is that micro LEDs do not cause color decay like OLEDs do. Due to the above advantages, micro LEDs have become a popular research target in the panel industry.

According to conventional techniques, in a process of manufacturing a full-color micro LED display device, it is necessary to pick up micro LED chips of red, green and blue (RGB) pixels one by one and transfer them onto corresponding electrodes of a target substrate. On the other hand, electrical connection between the micro LED and the substrate is realized by wire bonding or flip-chip bonding, thereby forming a full-color display device. The process of picking up and transferring is called micro LED transfer printing. In this process, it is necessary to pick up and lay down the micro LEDs many times, which greatly reduces the efficiency of producing the display device and increases the production costs of the micro LED display device.

In addition, after the micro LEDs are transferred to the target substrate, there are problems like light leakage and color mixing.

Therefore, there is an urgent need to solve the problems of conventional techniques.

SUMMARY

The present application provides a micro light emitting diode (LED) display panel and a transfer printing method of a micro LED, which can solve a problem of light leakage caused by a micro LED display panel produced by using a conventional transfer printing method, thereby preventing color mixing which results from light leakage.

Accordingly, the present application provides technical solutions as follows.

The present application provides a micro light emitting diode (LED) display panel, comprising:

a driving substrate comprising a thin film transistor (TFT) array layer and a plurality of bottom electrodes arranged in an array on the TFT array layer;

micro LED strips arranged spaced apart from each other on the driving substrate, wherein each micro LED strip comprises at least two micro LEDs;

wherein the micro LEDs are electrically connected to the bottom electrodes in a one-to-one correspondence, and the micro LEDs are electrically connected to TFTs in the TFT array layer through the bottom electrodes;

wherein a light shielding layer is disposed between each two adjacent rows of the bottom electrodes and/or between each two adjacent columns of the bottom electrodes, and each micro LED strip or each micro LED is disposed between adjacent two of the light shielding layers.

In the micro LED display panel of the present application, the micro LEDs are arranged in a one-dimensional array on each micro LED strip, and each micro LED strip is provided with a groove between each two adjacent ones of the micro LEDs.

In the micro LED display panel of the present application, the micro LEDs on the same micro LED strip have a same color, each light shielding layer is disposed between each two adjacent rows or each two adjacent columns of the bottom electrodes, each micro LED strip is disposed between each two adjacent ones of the light shielding layers, and the micro LEDs corresponding to the same row or the same column of the bottom electrodes are the same in color.

In the micro LED display panel of the present application, an insulating filler is disposed in the groove.

In the micro LED display panel of the present application, the micro LEDs on the same micro LED strip have different colors, a first light shielding layer is disposed between each two adjacent rows of the bottom electrodes, a second light shielding layer is disposed between each two adjacent columns of the bottom electrodes, the first light shielding layers are intersected with the second light shielding layers, and the micro LED is arranged between two adjacent first light shielding layers and/or between two adjacent second light shielding layers.

In the micro LED display panel of the present application, each first light shielding layer or each second light shielding layer is correspondingly filled into the groove of the corresponding micro LED strip.

In the micro LED display panel of the present application, each micro LED comprises an N-type electrode, an N-type semiconductor, a light emitting layer, a P-type semiconductor, and a P-type electrode which are sequentially stacked on each other, wherein the N-type electrode of each micro LED is electrically connected to a corresponding one of the bottom electrodes through solder, and the groove passes through the N-type semiconductor, the light emitting layer, and the P-type semiconductor.

In the micro LED display panel of the present application, at least two of the micro LEDs on each micro LED strip share one of the P-type electrodes, and each of the micro LEDs is disposed corresponding to one of the N-type electrodes.

The present application further provides a transfer printing method of a micro light emitting diode (LED), wherein the transfer printing method comprises steps as follows:

step S10: providing a micro LED array which comprises a plurality of micro LEDs arranged in an array;

step S20: cutting the micro LED array into a plurality of strip-shaped micro LED strips arranged in rows or columns, wherein each micro LED strip comprises at least two micro LEDs;

step S30: the micro LED comprising a bonding end, adhering an adhesive to one side of the micro LED strip facing away from the bonding ends of the micro LED strip, and then attaching a temporary carrier to the adhesive;

step S40: providing a driving substrate, wherein the driving substrate comprises a thin film transistor (TFT) array layer and multiple bottom electrodes arranged in an array on the TFT array layer, and a light shielding layer is arranged between two adjacent rows of the bottom electrodes and/or between two adjacent columns of the bottom electrodes;

step S50: applying solder to the bonding end of each micro LED of the micro LED strips, bonding the micro LED strips to the driving substrate, wherein each micro LED strip or each micro LED is disposed between two adjacent ones of the light shielding layers, and the bonding end of each micro LED is electrically connected to a TFT in the TFT array layer through the corresponding bottom electrode; and step S60: removing the temporary carrier and removing the adhesive to complete transfer printing of the micro LEDs.

In the transfer printing method of the present application, before the step S20, the transfer printing method further comprises steps as follows:

step S101: forming a groove between each two adjacent micro LEDs in a row direction or a column direction of the micro LED array.

In the transfer printing method of the present application, the micro LED comprises an N-type electrode, an N-type semiconductor, a light emitting layer, a P-type semiconductor, and a P-type electrode which are sequentially stacked on each other, wherein the N-type electrode of the micro LED is the bonding end, and the groove passes through the N-type semiconductor, the light emitting layer, and the P-type semiconductor.

In the transfer printing method of the present application, the micro LEDs are arranged in a one-dimensional array on each micro LED strip; in the step S20, the micro LED array is cut by taking one row or one column of the micro LEDs of a same color as one of the micro LED strips.

According to the transfer printing method of the present application, in the step S40, a light shielding layer is arranged between each two adjacent rows of the bottom electrodes or between each two adjacent columns of the bottom electrodes on the driving substrate.

According to the transfer printing method of the present application, in the step S50, after each micro LED strip is bonded to the driving substrate, the micro LED strip is arranged between two adjacent light shielding layers.

According to the transfer printing method of the present application, after the step S101 and before the step S20, the transfer printing method further comprises steps as follows:

step S102: filling an insulating filler in the groove.

In the transfer printing method of the present application, the micro LEDs are arranged in a one-dimensional array on each micro LED strip; in the step S20, the micro LED array is cut by taking the micro LEDs of different colors in one row or column as one of the micro LED strips.

According to the transfer printing method of the present application, in the step S40, a light shielding layer is arranged between each two adjacent rows of the bottom electrodes and between each two adjacent columns of the bottom electrodes on the driving substrate.

According to the transfer printing method of the present application, in the step S50, after the micro LED strip is bonded to the driving substrate, a portion of the light shielding layer corresponding to the groove is filled into the groove, and the micro LED is arranged between two adjacent light shielding layers.

Advantages of the Present Application:

The present application provides the micro LED display panel and the transfer printing method of the micro LED. The light shielding layer is arranged between the bottom electrodes of the driving substrate, and therefore, after being bonded to the driving substrate, the micro LED strips of different colors are spaced by the light shielding layers, or the micro LEDs of different colors on each micro LED strip are spaced by the light shielding layers, thereby solving a problem that light leakage occurs between micro LED strips of different colors or between micro LEDs of different colors on a conventional micro LED display panel.

BRIEF DESCRIPTION OF DRAWINGS

The following detailed description of the present application will make the technical solutions and other beneficial effects of the present application obvious in conjunction with the accompanying drawings and with reference to specific embodiments.

DETAILED DESCRIPTION OF EMBODIMENTS

Figure 1:
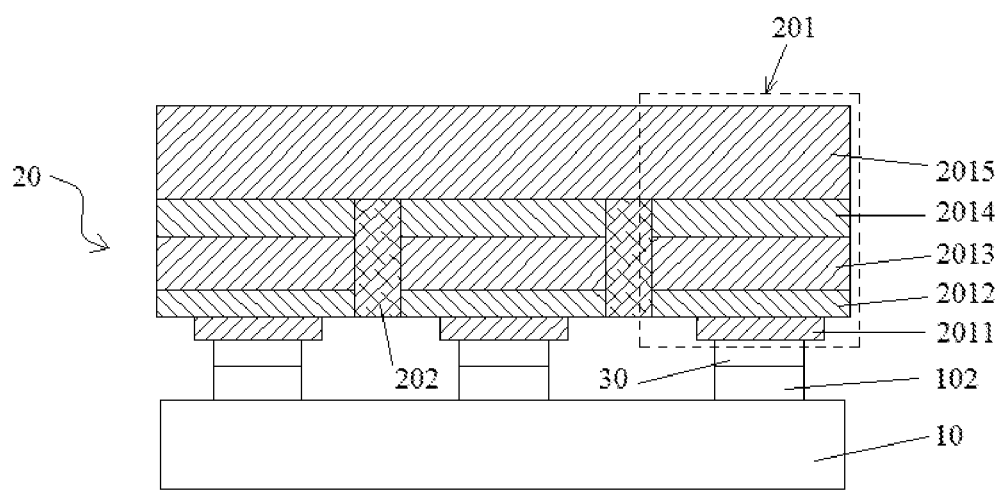
FIG. 1 is a cross-sectional view illustrating a micro LED display panel according to a first embodiment of the present application.

Technical solutions of the present invention will be clearly and completely described below with reference to the accompanying drawings and in conjunction with specific embodiments. Obviously, the described embodiments are only some of the embodiments of the present invention, but not all the embodiments. Based on the embodiments of the present invention, all other embodiments obtained by those skilled in the art without creative work fall into the protection scope of the present invention.

In the description of the present invention, it should be understood that the directional terms, such as "longitudinal", "transverse", "length", "width", "upper", "lower", "front", "rear", "left", "right", "vertical", and "horizontal", are based on the orientation or positional relationship shown in the drawings, and are only for the convenience of describing the present invention and simplifying the description. The directional terms do not indicate or imply that the device or element referred to must have a specific orientation or be constructed or operated in a specific orientation. Therefore, the directional terms cannot be understood as a limitation to the present invention. In addition, the terms "first" and "second" are used for illustrative purposes only, and cannot be understood as indicating or implying relative importance or implicitly indicating the number of technical features indicated. Therefore, the features defined as "first" and "second" may explicitly or implicitly include one or more of the features. In the description of the present invention, "multiple" means two or more, unless specifically defined otherwise.

In the present application, reference numerals and/or reference letters can be repeated in different examples, and such repetition is for simplicity and clarity, and does not indicate a relationship between various embodiments and/or configurations discussed.

The present application aims to solve a technical problem that light leakage occurs in a micro light emitting diode (LED) display panel produced by using a conventional micro LED transfer printing method, thereby preventing a color mixing problem which results from light leakage. The present invention can solve this technical problem.

Figure 7:
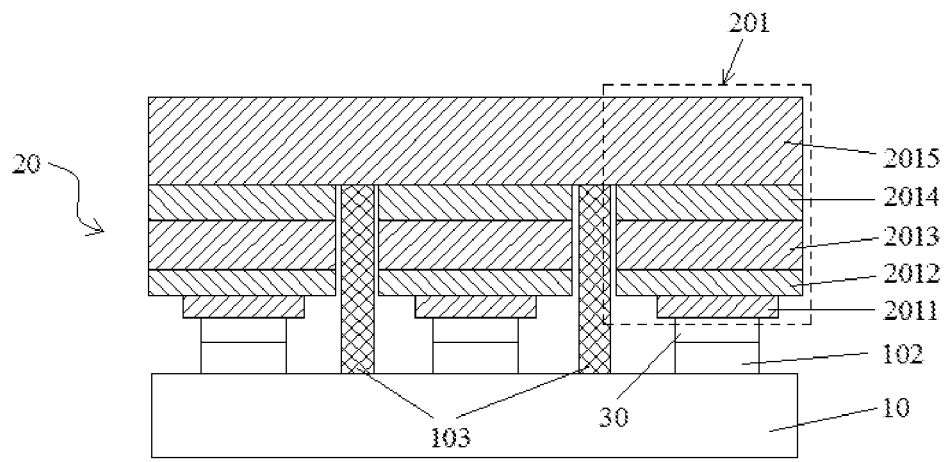
FIG. 7 is a cross-sectional view of the micro LED display panel according to a second embodiment of the present application.

With reference to FIG. 1 and FIG. 7, the present application provides a micro LED display panel, comprising:

a driving substrate 10, the driving substrate 10 comprising a thin film transistor (TFT) array layer 101 and a plurality of bottom electrodes 102 arranged in an array on the TFT array layer 101;

micro LED strips 20 arranged spaced apart from each other on the driving substrate 10, wherein each micro LED strip 20 comprises at least two micro LEDs 201;

wherein the micro LEDs 201 are electrically connected to the bottom electrodes 102 in a one-to-one correspondence, and the micro LEDs 201 are electrically connected to TFTs 1010 in the TFT array layer 101 through the bottom electrodes 102.

A light shielding layer 103 is disposed between each two adjacent rows of the bottom electrodes 102 and/or between each two adjacent columns of the bottom electrodes 102, and the micro LED strip 20 or the micro LED 201 is disposed between adjacent two of the light shielding layers 103.

Figure 2:
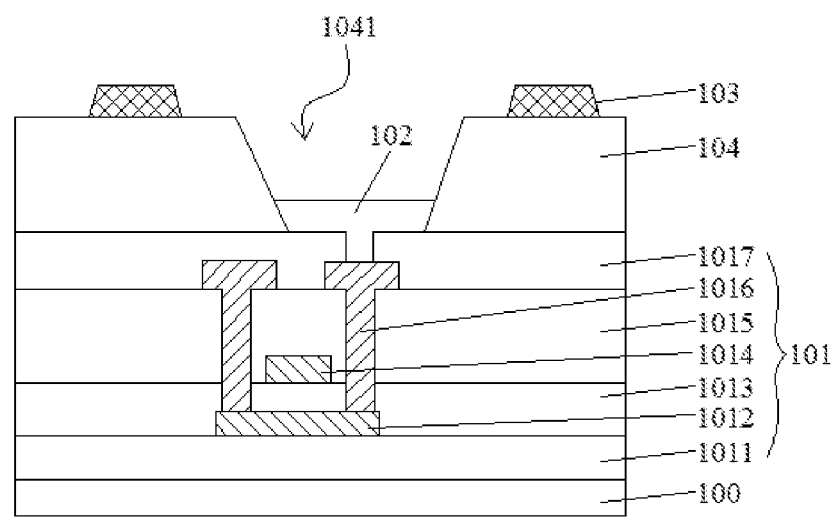
FIG. 2 is a cross-sectional view illustrating a driving substrate according to the present application.

Please refer to FIG. 2, which is a cross-sectional view illustrating the driving substrate 10 of the present application. The driving substrate 10 comprises a base substrate 100, the TFT array layer 101 disposed on the base substrate 100, the bottom electrodes 102 disposed on the TFT array layer 101, and the light shielding layer 103.

The TFT array layer 101 includes a buffer layer 1011, an active layer 1012, a gate insulating layer 1013, a gate electrode 1014, a dielectric layer 1015, a source/drain electrode 1016, and a barrier layer 1017. The buffer layer 1011 is formed on the base substrate 100, and the patterned active layer 1012 is formed on the buffer layer 1011. Two ends of the active layer 1012 are performed N-type doping and P-type doping, respectively, so that the active layer 1012 forms a first doped region and a second doped region at two sides of a channel layer. The gate insulating layer 1013 is formed on the active layer 1012. The gate electrode 1014 is formed on the gate insulating layer 1013, and a vertical projection of the gate electrode 1014 is in the channel layer. The dielectric layer 1015 is formed on the gate electrode 1014, and two via holes are extended from the dielectric layer 1015 toward the active layer 1012. The source/drain electrode 1016 is formed on the dielectric layer 1015, and the source/drain electrode 1016 is electrically connected to the first doped region and the second doped region through the two via holes. The barrier layer 1017 is formed on the source/drain electrode 1016. A TFT 1010 comprises the active layer 1012, the gate 1014, and the source/drain electrode 1016. It can be understood that, according to actual needs, the TFT 1010 can also be other types of TFTs, such as an ordinary TFT or an HTPS-TFT.

The bottom electrodes 102 are arranged in an array on the barrier layer 1017, and the bottom electrode 102 is electrically connected to the source/drain electrode 1016 through the via hole in the barrier layer 1017. A planarization layer 104 is disposed on the barrier layer 1017, and the planarization layer 104 is patterned to form a pixel hole 1041.

The light shielding layer 103 is disposed on the planarization layer 104, and the light shielding layer 103 is disposed between two adjacent rows of the bottom electrodes 102 or between two adjacent columns of the bottom electrodes 102; or alternatively, the light shielding layers 103 form a grid shape and are arranged between two adjacent rows and two adjacent columns of the bottom electrodes 102. The light shielding layer 103 can be made of a material having a light shielding property, such as a black matrix, a black organic photoresist material, or polyimide.

Figure 3:
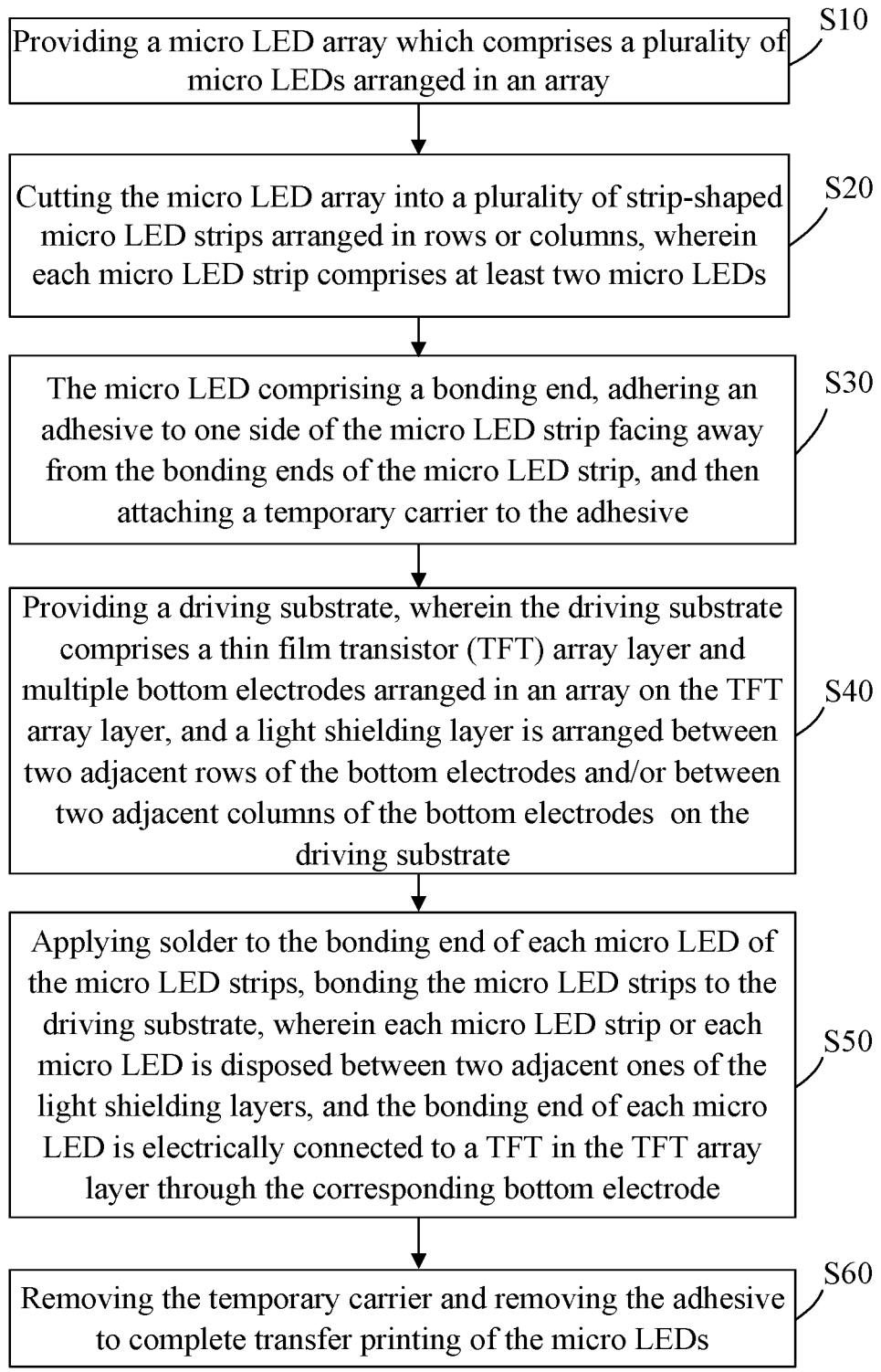
FIG. 3 is a process flow diagram illustrating a transfer printing method of a micro LED in the micro LED display panel of the present application.

Referring to FIG. 3, the present application provides a transfer printing method of a micro light emitting diode (LED), wherein the transfer printing method comprises steps as follows:

step S10: providing a micro LED array which comprises a plurality of micro LEDs arranged in an array;

step S20: cutting the micro LED array into a plurality of strip-shaped micro LED strips arranged in rows or columns, wherein each micro LED strip comprises at least two micro LEDs;

step S30: the micro LED comprising a bonding end, adhering an adhesive to one side of the micro LED strip facing away from the bonding ends of the micro LED strip, and then bonding a temporary carrier to the adhesive;

step S40: providing a driving substrate, wherein the driving substrate comprises a thin film transistor (TFT) array layer and multiple bottom electrodes arranged in an array on the TFT array layer, and a light shielding layer is arranged between two adjacent rows of the bottom electrodes and/or between two adjacent columns of the bottom electrodes;

step S50: applying solder to the bonding end of each micro LED of the micro LED strips, bonding the micro LED strips to the driving substrate, wherein each micro LED strip or each micro LED is disposed between two adjacent ones of the light shielding layers, and the bonding end of each micro LED is electrically connected to a TFT in the TFT array layer through the corresponding bottom electrode; and step S60: removing the temporary carrier and removing the adhesive to complete transfer printing of the micro LEDs.

The present application provides the micro LED display panel and the transfer printing method of the micro LED.

The light shielding layer is arranged between the bottom electrodes of the driving substrate, and therefore, after being bonded to the driving substrate, the micro LED strips of different colors are spaced by the light shielding layers, or the micro LEDs of different colors on each micro LED strip are spaced by the light shielding layers, thereby solving a problem that light leakage occurs between micro LED strips of different colors or between micro LEDs of different colors on a conventional micro LED display panel.

The micro LED display panel and the transfer printing method of the micro LED are described in detail hereinafter in combination with specific embodiments.

First Embodiment

Figure 4:
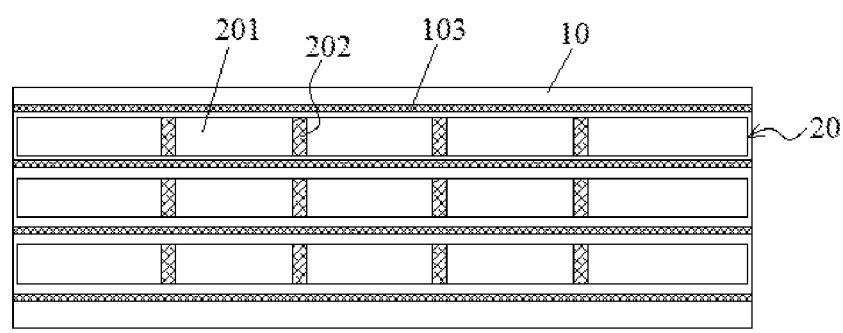
FIG. 4 is a top view illustrating the micro LED display panel according to the first embodiment of the present application.

Please refer to FIG. 1 and FIG. 4. FIG. 1 is a cross-sectional view of the micro LED display panel according to the first embodiment of the present application. FIG. 4 is a top view of the micro LED display panel according to the first embodiment of the present application. The micro LED display panel comprises a driving substrate 10 and a plurality of micro LED strips 20. The driving substrate 10 comprises a thin film transistor (TFT) array layer 101, a bottom electrode 102 and a light shielding layer 103. In the present embodiment, the light shielding layer 103 is arranged between two adjacent rows of the bottom electrodes 102 or between two adjacent columns of the bottom electrodes 102.

Here, the light shielding layer 103 is arranged between two adjacent rows of the bottom electrodes 102 as an example for description. FIG. 1 shows a longitudinal cross-section of the micro LED display panel in a row direction of the bottom electrodes. The micro LED strip 20 comprises at least two micro LEDs 201. The micro LEDs 201 are arranged in a one-dimensional array on the micro LED strip 20.

The micro LED 201 comprises an N-type electrode 2011, an N-type semiconductor 2012, a light emitting layer 2013, a P-type semiconductor 2014, and a P-type electrode 2015 which are sequentially stacked on each other. The N-type electrode 2011 of the micro LED 201 is electrically connected to the bottom electrode 102 through solder 30. The N-type electrode 2011 can be a metal electrode, and the P-type electrode 2015 can be a transparent electrode. The solder 30 can be conductive silver paste, solder paste, or etc., and the present application is not limited in this regard.

The micro LED strip 20 is provided with a groove between two adjacent micro LEDs 201, and the groove passes through the N-type semiconductor 2012, the light emitting layer 2013, and the P-type semiconductor 2014, so that the micro LED strip 20 is divided into the micro LEDs 201. The micro LEDs 201 on the micro LED strip 20 share one P-type electrode 2015, and each of the micro LEDs 201 is disposed corresponding to one of the N-type electrodes 2011.

An insulating filler 202 is filled in the groove 202. The present embodiment is not intended to limit material of the insulating filler 202, and the insulating filler can be an insulating organic material or an inorganic material.

In the present embodiment, the micro LEDs 201 comprise a plurality of red micro LEDs, a plurality of green micro LEDs, and a plurality of blue micro LEDs. The micro LEDs 201 on the same micro LED strip 20 have the same color. The micro LED strip 20 is disposed between adjacent two of the light shielding layers 103, and the micro LEDs 201 arranged corresponding to the same row of the bottom electrodes 102 have the same color. If the light shielding layer 103 is disposed between two adjacent columns of the bottom electrodes 102, the micro LEDs 201 corresponding to the same column of the bottom electrodes 102 have the same color.

In one embodiment, the micro LED display panel further comprises a top electrode (not illustrated), and the top electrode is electrically connected to the P-type electrode 2015 through a via hole. An electrical current is applied to the micro LED 201 through the bottom electrode 102 and the top electrode, so that the light emitting layer 2013 of the micro LED 201 emits light, and the emitted light passes out of the P-type semiconductor 2014.

In the present embodiment, a thickness of the light shielding layer 103 is flush with a height of the micro LED strip 20 after the micro LED strip 20 is bonded, or is slightly lower than the height of the micro LED strip 20, thereby ensuring that the light shielding layer 103 can effectively block light.

The "micro LED" herein refers to an LED having a size of less than or equal to several millimeters (such as several millimeters, hundreds of micrometers, or 100 micrometers or less).

Figure 5:
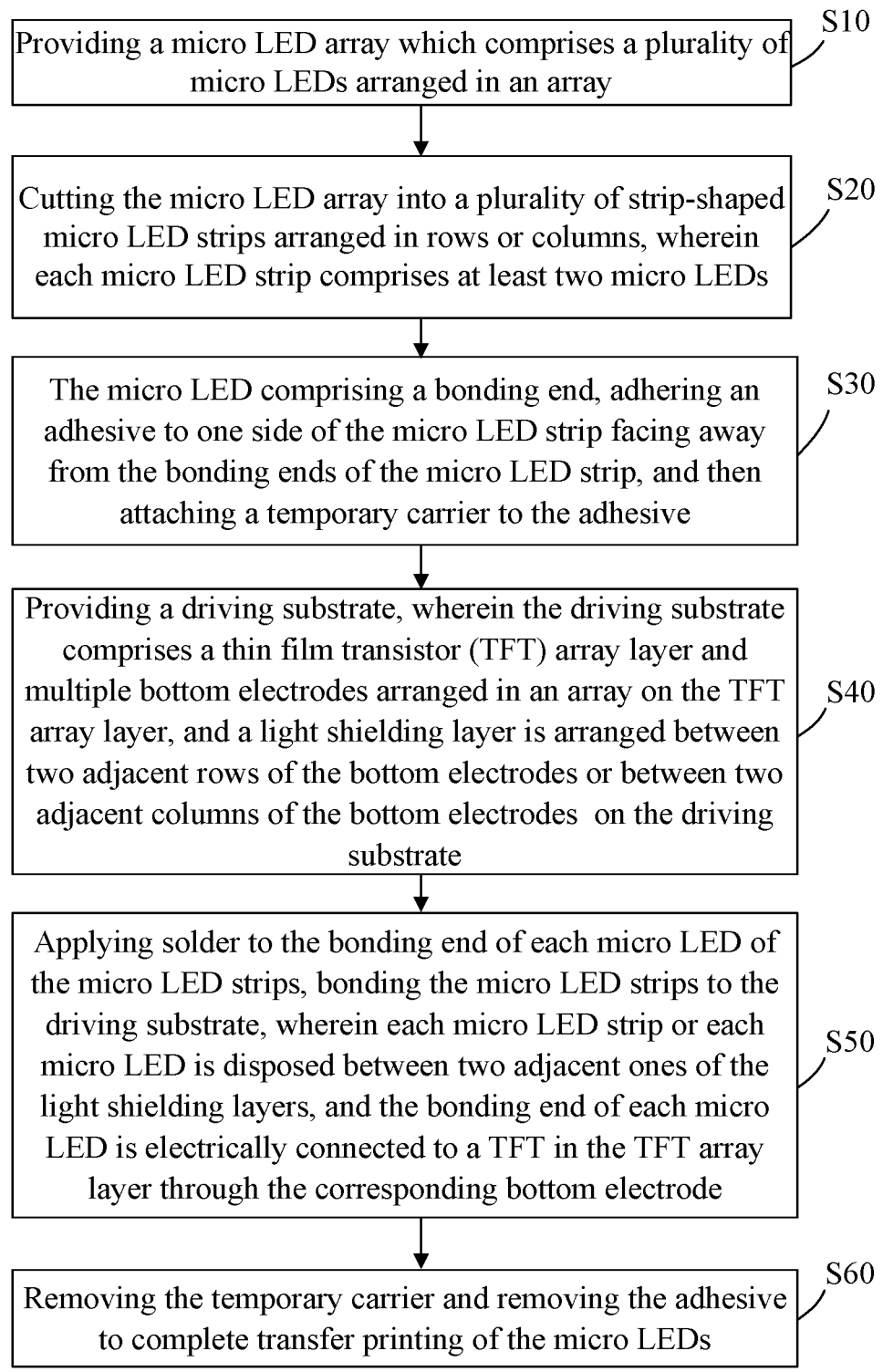
FIG. 5 is a process flow diagram illustrating the transfer printing method of the micro light emitting diode in the micro LED display panel according to the first embodiment of the present application.

Please refer to FIG. 5, which shows a transfer printing method of a micro LED according to the first embodiment of the present application. The transfer printing method comprises steps as follows.

In step S10, a micro LED array is provided, wherein the micro LED array comprises a plurality of micro LEDs arranged in an array.

Figure 6A:
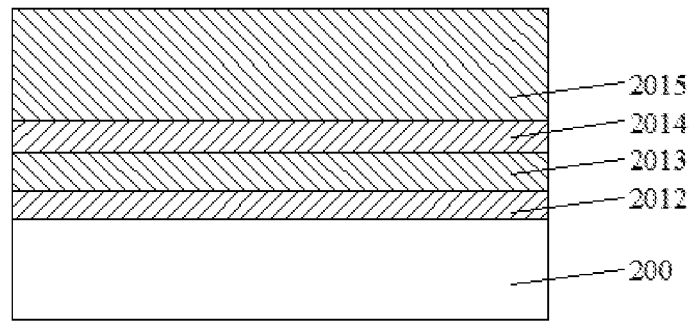
FIGS. 6A to 6H are schematic diagrams illustrating the transfer printing method of the micro LED in the micro LED display panel according to the first embodiment of the present application.

Specifically, manufacturing the micro LED array comprises the following steps:

As shown in FIG. 6A, first, an N-type semiconductor 2012, a light emitting layer 2013, a P-type semiconductor 2014, and a P-type electrode 2015 stacked on each other are formed on a substrate 200.

Figure 6B:
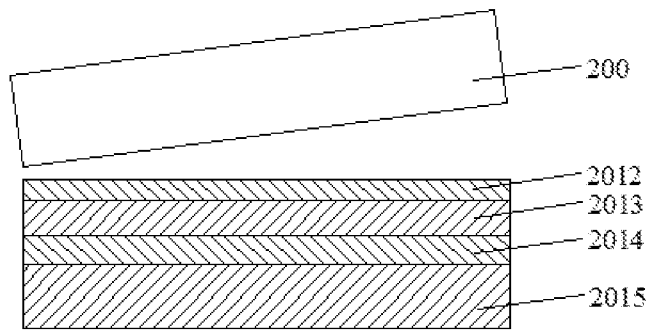

As shown in FIG. 6B, the substrate 200 is peeled from the N-type semiconductor 2012 after flipped 180 degrees (180°).

Figure 6C:
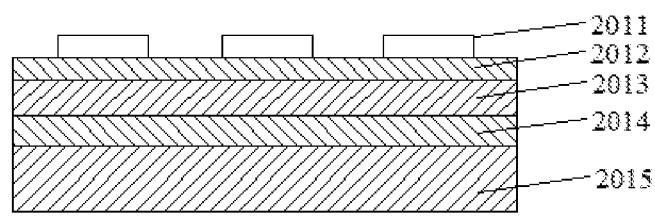

As shown in FIG. 6C, a plurality of patterned N-type electrodes 2011 are formed on the N-type semiconductor 2012. Each N-type electrode 2011 is arranged corresponding to one micro LED to form the micro LED array.

Figure 6D:
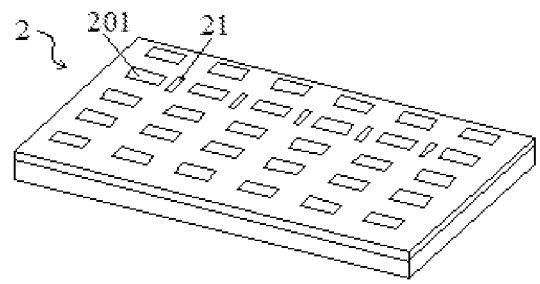
Figure 6E:
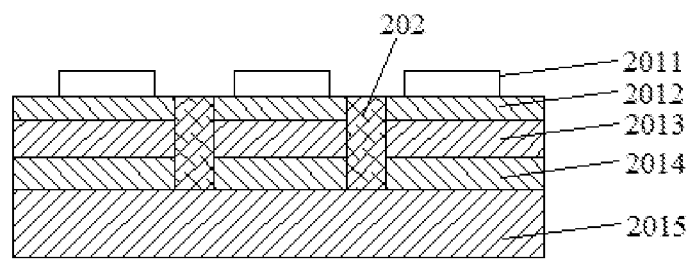

After the micro LED array 2 is formed, step S10 further comprises step S101 and step S102.

step S101: as shown in FIG. 6D, a groove 21 is formed between each two adjacent micro LEDs 201 in a row direction or a column direction of the micro LED array.

It can be understood that, in FIG. 6D, only one row of the micro LEDs 201 is taken as an example for description.

step S102: an insulating filler 202 is filled in the groove 21.

Figure 6F:
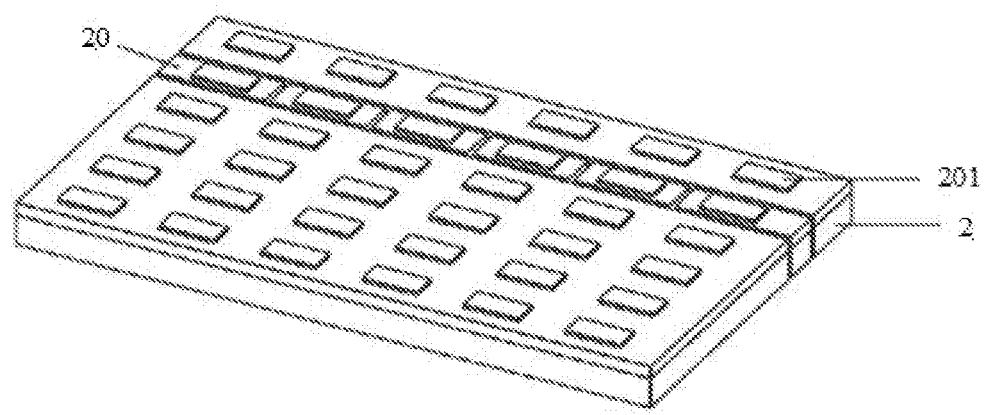

In step S20, as shown in FIG. 6F, the micro LED array 2 is cut into a plurality of strip-shaped micro LED strips 20 arranged in rows or columns, by taking one row or one column of the micro LEDs 201 of a same color as one of the micro LED strips 20.

Each micro LED strip 20 comprises at least two micro LEDs 201.

Figure 6G:
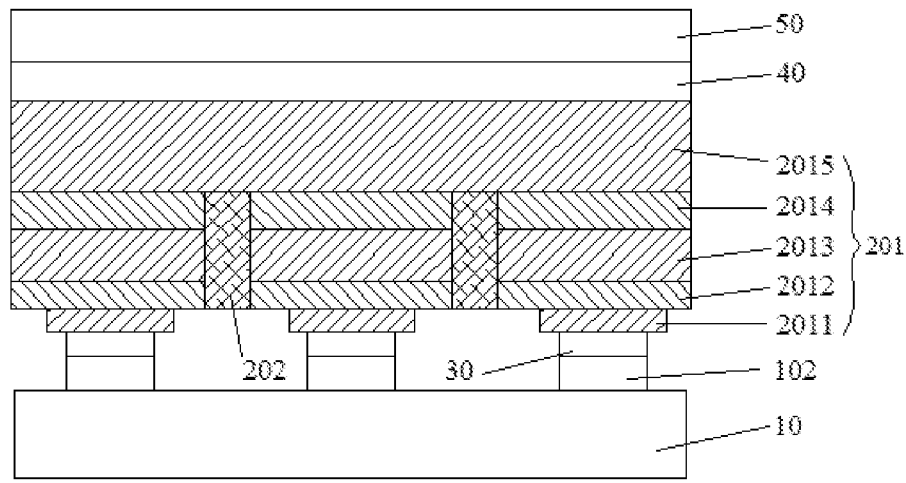

In step S30, as shown in FIG. 6G, the micro LED comprises a bonding end, an adhesive is adhered to one side of the micro LED strip 20 facing away from the bonding ends of the micro LED strip 20, and then a temporary carrier is attached to the adhesive.

The bonding end of the micro LED 201 is the N-type electrode 2011.

The adhesive 40 is used to provide adhesiveness, and can be SU-8 glue, benzocyclobutene, polyimide, polybenzoxazole resin, or silicone glue; the present application is not limited in this regard. The temporary carrier 50 should be a substance that can be easily removed, can support, and has a certain thickness. The temporary carrier can be made of silicon, sapphire, glass, or ceramic, or can be a polymer substrate.

In step S40, as shown in FIG. 6G, a driving substrate 10 is provided, wherein the driving substrate 10 comprises a thin film transistor (TFT) array layer and multiple bottom electrodes 102 arranged in an array on the TFT array layer, and a light shielding layer is arranged between two adjacent rows of the bottom electrodes 102 or between two adjacent columns of the bottom electrodes 102.

In step S50, as shown in FIG. 6G, solder 30 is applied to the bonding end of each micro LED 201 of the micro LED strips 20, the micro LED strips 20 are bonded to the driving substrate 10, wherein each micro LED strip 20 is disposed between two adjacent ones of the light shielding layers 103.

The strip-shaped micro LED strips 20 and the driving substrate 10 are aligned and combined with each other. The alignment can be achieved by using an optical microscope, so that the N-type electrodes 2011 of the micro light emitting diode strip 20 and the bottom electrodes 102 on the driving substrate 10 can be arranged in a one-to-one correspondence. The bonding end of the micro LED 201 is electrically connected to a TFT in the TFT array layer through the bottom electrode 102.

Figure 6H:
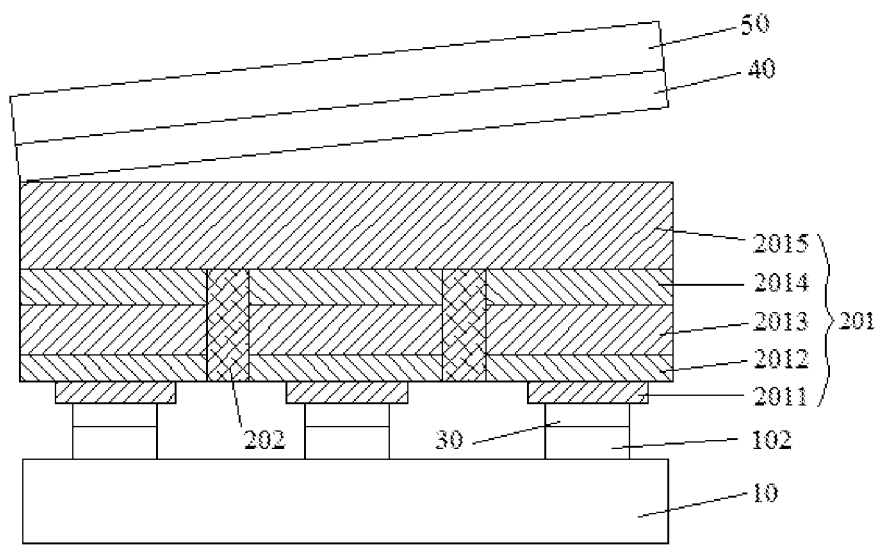

In step S60, as shown in FIG. 6H, the temporary carrier 50 is removed, and the adhesive 40 is removed to complete transfer printing of the micro LEDs 201.

It should be noted that the adhesive 40 needs to be treated in accordance with the characteristics of the adhesive 40. The adhesive 40 can be selected. If a photosensitive adhesive is used, UV exposure or radiation can be used to reduce the viscosity. If an adhesive that can change its viscosity through heat treatment is selected, then the adhesive can be heated to reduce the viscosity.

The temporary carrier 50 is peeled off by laser, and the adhesive 40 can be removed by dry etching or wet etching.

In the present embodiment, the light shielding layers are disposed between the bottom electrodes of the driving substrate, so that after the micro LED strips are bonded to the driving substrate, the micro LEDs of different colors on the micro LED strips are spaced by the light shielding layers. Accordingly, the present application solves a technical problem that light leakage may occur between micro LEDs of different colors on a conventional micro LED display panel, thus preventing color mixing resulting from light leakage.

Second Embodiment

Figure 8:
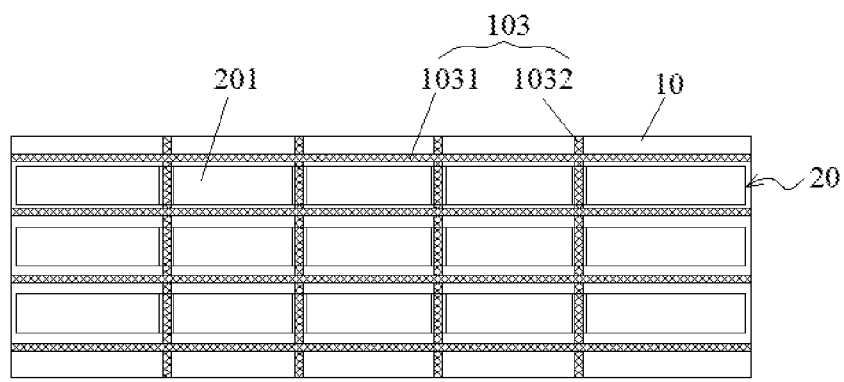
FIG. 8 is a top view illustrating the micro LED display panel according to the second embodiment of the present application.

Please refer to FIG. 7 and FIG. 8. A structure of the micro LED display panel of the second embodiment is the same as or similar to that of the micro LED display panel of the first embodiment. The difference between the present embodiment and the first embodiment is that the micro LEDs 201 on the same micro LED strip 20 are different in color, and a first light shielding layer 1031 is disposed between two adjacent rows of the bottom electrodes 102. A second light shielding layer 1032 is disposed between two adjacent columns of the bottom electrodes 102. The first light shielding layer 1031 and the second light shielding layer 1032 are intersected with each other, and the micro LEDs 201 are disposed between each two adjacent first light shielding layers 1031 and/or each two adjacent second light shielding layers 1032.

Except for the above difference, the structure of the micro LED display panel of the present embodiment is the same as that of the micro LED display panel of the first embodiment. For specific details of the structure, please refer to the description in the first embodiment, so the details are repeated herein.

Figure 9:
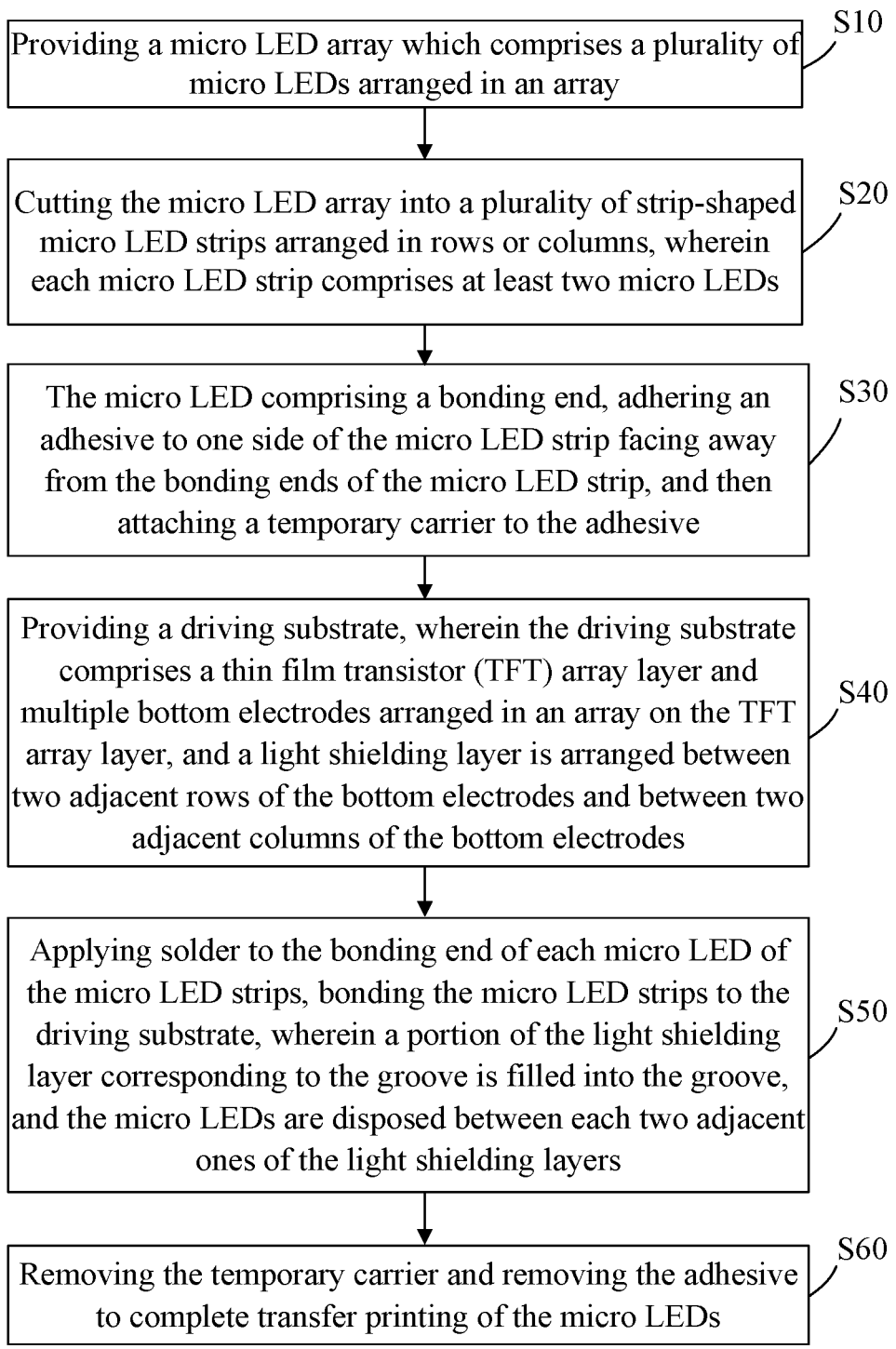
FIG. 9 is a process flow diagram illustrating the transfer printing method of the micro LED in the micro LED display panel according to the second embodiment of the present application.

FIG. 9 is a process flow diagram illustrating the transfer printing method of the micro LED in the micro LED display panel according to the second embodiment of the present application. The transfer printing method comprises steps as follows.

In step S10, a micro LED array which comprises a plurality of micro LEDs arranged in an array is provided.

The step S10 in the present embodiment is the same as the step S10 in the first embodiment. For details, please refer to the description in the first embodiment and FIGS. 6A to 6E, and a detailed description is omitted herein for brevity.

In step S20, the micro LED array is cut into a plurality of strip-shaped micro LED strips arranged in rows or columns by taking one row or one column of the micro LEDs of different colors as one of the micro LED strips, wherein each micro LED strip comprises at least two micro LEDs.

For details regarding the cutting of the micro LED array, please refer to FIG. 6F of the first embodiment.

In step S30, the micro LED comprises a bonding end, an adhesive is adhered to one side of the micro LED strip facing away from the bonding ends of the micro LED strip, and then a temporary carrier is attached to the adhesive.

In step S40, as shown in FIGS. 2 and 8, a driving substrate 10 is provided, wherein the driving substrate 10 comprises a thin film transistor (TFT) array layer 101 and multiple bottom electrodes 102 arranged in an array on the TFT array layer 101, and a light shielding layer 103 is arranged between each two adjacent rows of the bottom electrodes 102 and between each two adjacent columns of the bottom electrodes 102.

In step S50, as shown in FIG. 7, solder 30 is applied to the bonding end of each micro LED 201 of the micro LED strips 20, the micro LED strips are bonded to the driving substrate 10, wherein a portion of the light shielding layer 103 corresponding to the groove is filled into the groove, and the micro LEDs are disposed between each two adjacent ones of the light shielding layers.

The bonding end of each micro LED 201 is electrically connected to a TFT in the TFT array layer 101 through the corresponding bottom electrode 102.

In step S60, the temporary carrier is removed, and the adhesive is removed to complete transfer printing of the micro LEDs.

For details regarding the removal of the temporary carrier and the adhesive, please refer to FIG. 6H of the first embodiment.

In the present embodiment, the light shielding layers are disposed between the bottom electrodes of the driving substrate, so that after the micro LED strips are bonded to the driving substrate, the micro LEDs of different colors on the micro LED strips are spaced by the light shielding layer. Accordingly, the present application solves a technical problem that light leakage may occur between micro LEDs of different colors on a conventional micro LED display panel, thus preventing color mixing resulting from light leakage.

In summary, although the present application has been disclosed above with preferable embodiments, the above embodiments are not intended to limit the present application. Those skilled in the art can make various modifications without departing from the spirit and scope of the present application. The protection scope of the present application shall be defined by the appended claims.

What is claimed is:

1. A transfer printing method of a micro light emitting diode (LED), wherein the transfer printing method comprises steps as follows:
    step S10: providing a micro LED array which comprises a plurality of micro LEDs arranged in an array;
    step S20: cutting the micro LED array into a plurality of strip-shaped micro LED strips arranged in rows or columns, wherein each micro LED strip comprises at least two micro LEDs;
    step S30: the micro LED comprising a bonding end, adhering an adhesive to one side of the micro LED strip facing away from the bonding ends of the micro LED strip, and then attaching a temporary carrier to the adhesive;
    step S40: providing a driving substrate, wherein the driving substrate comprises a thin film transistor (TFT) array layer and multiple bottom electrodes arranged in an array on the TFT array layer, a light shielding layer is arranged between two adjacent rows of the bottom electrodes and/or between two adjacent columns of the bottom electrodes, each light shielding layer extends from the driving substrate, and a thickness of each light shielding layer is flush with a height of the corresponding micro LED strip;
    step S50: applying solder to the bonding end of each micro LED of the micro LED strips, bonding the micro LED strips to the driving substrate, wherein each micro LED strip or each micro LED is disposed between two adjacent ones of the light shielding layers, and the bonding end of each micro LED is electrically connected to a TFT in the TFT array layer through the corresponding bottom electrode; and
    step S60: removing the temporary carrier and removing the adhesive to complete transfer printing of the micro LEDs,
    wherein before the step S20, the transfer printing method further comprises steps as follows:
    step S101: forming a groove between each two adjacent micro LEDs in a row direction or a column direction of the micro LED array.

2. The transfer printing method according to claim 1, wherein the micro LED comprises an N-type electrode, an N-type semiconductor, a light emitting layer, a P-type semiconductor, and a P-type electrode which are sequentially stacked on each other, wherein the N-type electrode of the micro LED is the bonding end, and the groove passes through the N-type semiconductor, the light emitting layer, and the P-type semiconductor.

3. The transfer printing method according to claim 1, wherein the micro LEDs are arranged in a one-dimensional array on each micro LED strip; in the step S20, the micro LED array is cut by taking one row or one column of the micro LEDs of a same color as one of the micro LED strips.

4. The transfer printing method according to claim 3, wherein in the step S40, a light shielding layer is arranged between each two adjacent rows of the bottom electrodes or between each two adjacent columns of the bottom electrodes on the driving substrate.

5. The transfer printing method according to claim 4, wherein in the step S50, after each micro LED strip is bonded to the driving substrate, the micro LED strip is arranged between two adjacent light shielding layers.

6. The transfer printing method according to claim 3, wherein after the step S101 and before the step S20, the transfer printing method further comprises steps as follows:
    step S102: filling an insulating filler in the groove.

7. The transfer printing method according to claim 1, wherein the micro LEDs are arranged in a one-dimensional array on each micro LED strip; in the step S20, the micro LED array is cut by taking the micro LEDs of different colors in one row or column as one of the micro LED strips.

8. The transfer printing method according to claim 7, wherein in the step S40, a light shielding layer is arranged between each two adjacent rows of the bottom electrodes and between each two adjacent columns of the bottom electrodes on the driving substrate.

9. The transfer printing method according to claim 8, wherein in the step S50, after the micro LED strip is bonded to the driving substrate, a portion of the light shielding layer corresponding to the groove is filled into the groove, and the micro LED is arranged between two adjacent light shielding layers.

* * * * *